United States Patent
Schweighofer

(10) Patent No.: US 6,304,096 B1
(45) Date of Patent: Oct. 16, 2001

(54) MEASURING DEVICE FOR MEASURING THE INTERMEDIATE CIRCUIT VOLTAGE OF GRADIENT AMPLIFIERS

(75) Inventor: Peter Schweighofer, Nuernberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/406,703

(22) Filed: Sep. 28, 1999

(30) Foreign Application Priority Data

Sep. 30, 1998 (DE) .............................................. 198 44 980

(51) Int. Cl.⁷ .................................................. G01R 27/22
(52) U.S. Cl. ............................ 324/765; 324/678; 327/514
(58) Field of Search .................................. 324/765, 403, 324/678, 76.65, 409, 410; 327/514

(56) References Cited

U.S. PATENT DOCUMENTS

| | | | |
|---|---|---|---|
| 4,090,664 | * 5/1978 | Elderkin | ................................... 236/11 |
| 4,236,187 | * 11/1980 | Mochizuki et al. | .................... 361/36 |
| 4,281,378 | * 7/1981 | Ogino et al. | ............................. 363/96 |
| 4,519,683 | * 5/1985 | Hagyuda et al. | ............... 354/127.11 |
| 4,870,902 | * 10/1989 | Simon et al. | ......................... 102/201 |
| 4,922,906 | * 5/1990 | Takeuchi et al. | ..................... 128/419 |
| 4,999,546 | * 3/1991 | Koda et al. | ........................... 315/225 |
| 5,321,490 | * 6/1994 | Olson et al. | .............................. 356/5 |
| 5,371,359 | * 12/1994 | Hagiuda et al. | ...................... 250/229 |

* cited by examiner

Primary Examiner—Safet Metjahic
Assistant Examiner—Vincent Q. Nguyen
(74) Attorney, Agent, or Firm—Schiff Hardin & Waite

(57) ABSTRACT

A measuring device for measuring the intermediate circuit voltage of a gradient amplifier of a magnetic resonance imaging apparatus has a measuring circuit with a potential-dividing connection to a voltage indicator, the measuring circuit being connected in series with a discharging resistor of the intermediate circuit capacitance, and being driven from the discharging current via the discharging resistor.

4 Claims, 2 Drawing Sheets

MEASURING DEVICE FOR MEASURING THE INTERMEDIATE CIRCUIT VOLTAGE OF GRADIENT AMPLIFIERS

BACKGROUND OF THE INVENTION

1. Field of the Invention

The present invention is directed to a measuring device for measuring the intermediate circuit voltage of a gradient amplifier of a magnetic resonance imaging (MRI) apparatus.

2. Description of the Prior Art

In a typical magnetic resonance imaging apparatus, a number of gradient coils (usually three gradient coils for the x, y and z axes, respectively) are employed to spatially encode the magnetic resonance signals arising from an examination subject after excitation of nuclear spins in the subject. Each gradient coil is operated by a gradient amplifier, and each gradient amplifier typically includes a number of intermediate amplifier circuits or stages. Ideally, it would be desirable to measure or monitor the intermediate circuit voltage of each of these intermediate circuits, however, due to their large number this is impractical for reasons of cost and complexity. An additional problem in measuring the intermediate circuit voltage under such circumstances is that this voltage is usually a floating voltage, i.e., it is not always referenced to a reference voltage or ground.

For these reasons, generally only monitoring of one voltage limiting value or two voltage limiting values takes place whereby a threshold detector is driven by a power Zener diode. If more information is needed, measuring circuits in the intermediate circuit connected parallel to the discharging resistor of the intermediate circuit capacitor are utilized. Such measuring circuits, however, are not only considerably more expensive and require considerably more outlay in terms of circuitry, but also still require an auxiliary power supply.

SUMMARY OF THE INVENTION

An object of the present invention is to provide a measuring device for measuring the intermediate circuit voltage of a gradient amplifier, which is simply and inexpensively constructed and which does not need its own auxiliary power supply.

This object is achieved in accordance with the invention in a measuring device having a measuring circuit with a potential-dividing connection to a voltage indicating device, the measuring circuit being connected in series with the discharging resistor of the intermediate circuit capacitor and being driven from the discharging current via the discharging resistor.

Such a circuit is simply constructed and operates without an auxiliary energy supply. In a further embodiment of the invention a driver that is preferably fashioned as a transistor is driven via an astable flip-flop, this driver is connected to the low impedance path of a light-emitting diode that emits light at a frequency that is proportional to the intermediate circuit voltage. The intermediate circuit voltage is identified in an evaluating unit that contains a photoreceiver that detects the light pulses.

In a particulary simple inexpensive embodiment the astable flip-flop contains a thyristor tetrode that is driven via a voltage divider having a Zener diode lying connected in parallel with a capacitor that is connected in series with the discharging resistor. The thyristor tetrode simply fashioned by two interconnected transistors.

DESCRIPTION OF THE PREFERRED EMBODIMENTS

Figure 1:
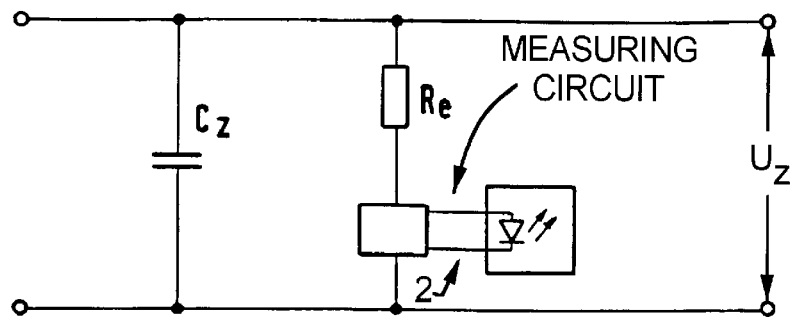
FIG. 1 schematically shows the arrangement of an inventive measuring circuit in the circuit path between a gradient amplifier (not shown) and a gradient coil (not shown) driven by the gradient amplifier.

FIG. 1 shows an intermediate circuit capacitance or $C_z$, at the output of a power supply unit, usually formed by multiple capacitors and usually followed by a discharging resistor $R_e$. The discharging resistor $R_e$ is designed such that it can effect a discharge of the intermediate circuit capacitance $C_z$ within a few minutes in order to avoid danger to service personnel, as would exist if the intermediate circuit capacitance $C_z$ would remain charged for days with excessively high voltage, for example.

Figure 2:
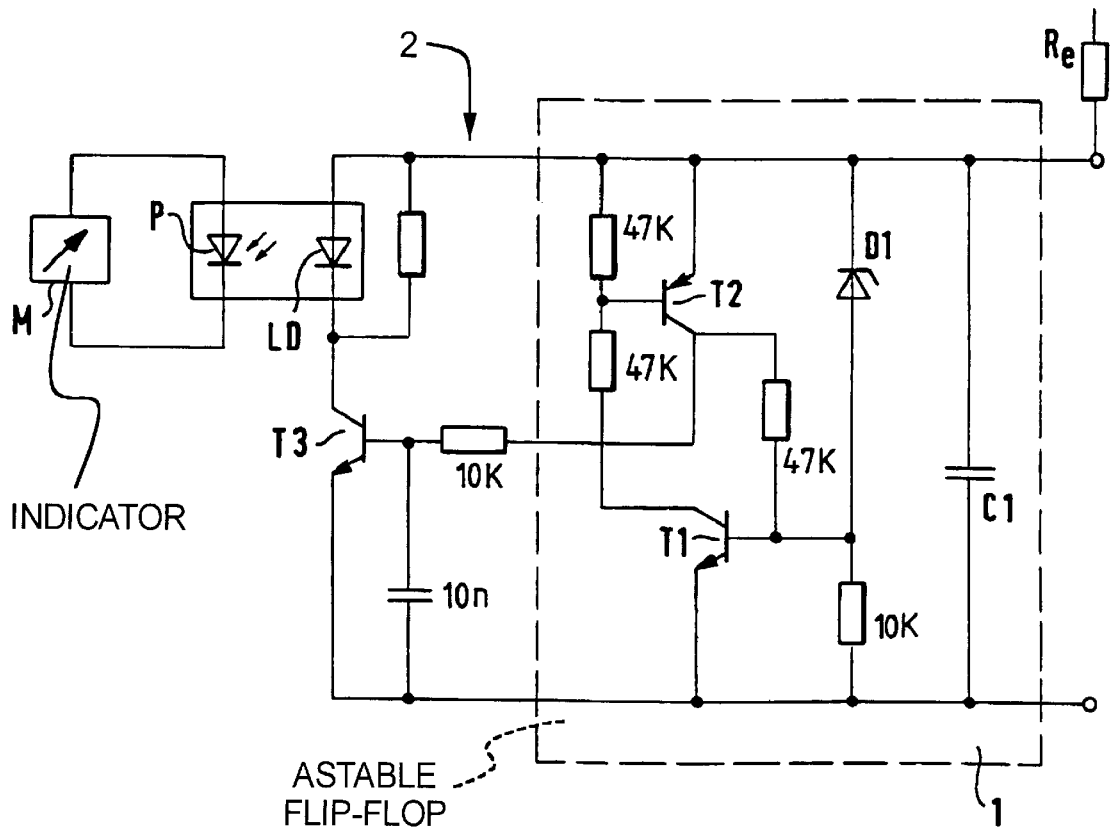
FIG. 2 is a circuit diagram of the measuring circuit utilized in the arrangement according to FIG. 1.

Inventively, this discharging resistor $R_e$ is connected in series with the actual measuring circuit 2. The measuring circuit 2 is shown in detail in FIG. 2. This measuring circuit 2 contains an astable flip-flop 1 for operating a driver that is fashioned as a transistor T3, for an optical coupler containing a light-emitting diode LD in the exemplary embodiment. The light pulses emitted by the light-emitting diode LD are detected by a photodiode P and are displayed as voltage value at a voltage indicator M. The indicator M "translates" the current pulses, produced by the photodetector P from the detected light pulses, into a voltage vale dependent on a characteristic, which has been previously empirically detected, representing the relation between the frequency of the light pulses and the intermediate circuit voltage $U_z$.

When the intermediate circuit voltage is close to zero, practically no voltage drop occurs at a capacitor C1 connected in series with $R_e$, and thus a Zener diode D1 connected in parallel with C1 remains inhibited. Transistors T1, T2 and T3 then are non-conducting and the light-emitting diode LD remains dark. When the intermediate circuit voltage then exceeds the Zener voltage of the Zener diode D1, the transistor T1 initially becomes conductive and drives the transistor T2, which, together, form a thyristor tetrode, this thyristor tetrode forming a flip-flop circuit in combination with the driving voltage divider of across the capacitor C1. This driving voltage divider is formed by resistors (in the exemplary embodiment, 10K and 47K resistors) connected in series and in parallel with the Zener diode D1, and resistors (in the exemplary embodiment, two 47K resistors) connected at the base of transistor T2. The transistor T3 that serves as driver for the light-emitting diode LD thereby conducts, and the light-emitting diode LD emits light. The capacitor C1 discharges via the low-resistance path of the light-emitting diode circuit, causing the thyristor that is formed by the transistors T1, T2, quench and the transistor T3 ceases to conduct, and the light-emitting diode LD ceases to emit light, so that a light pulse has been produced. The capacitor C1 is slowly recharged by the discharging resistor $R_e$ and the previously described procedure starts again. A saw-tooth-shaped voltage thereby arises at the capacitor C1 and the optical coupler with the light-emitting diode LD blinks with a frequency that is almost linearly proportional to the intermediate circuit voltage. If the intermediate circuit voltage finally exceeds a maximum value, the thyristor no longer quenches and the light-emitting diode changes to steady emission light. An upper transgression of the measuring range can be immediately recognized in this way.

Figure 3:
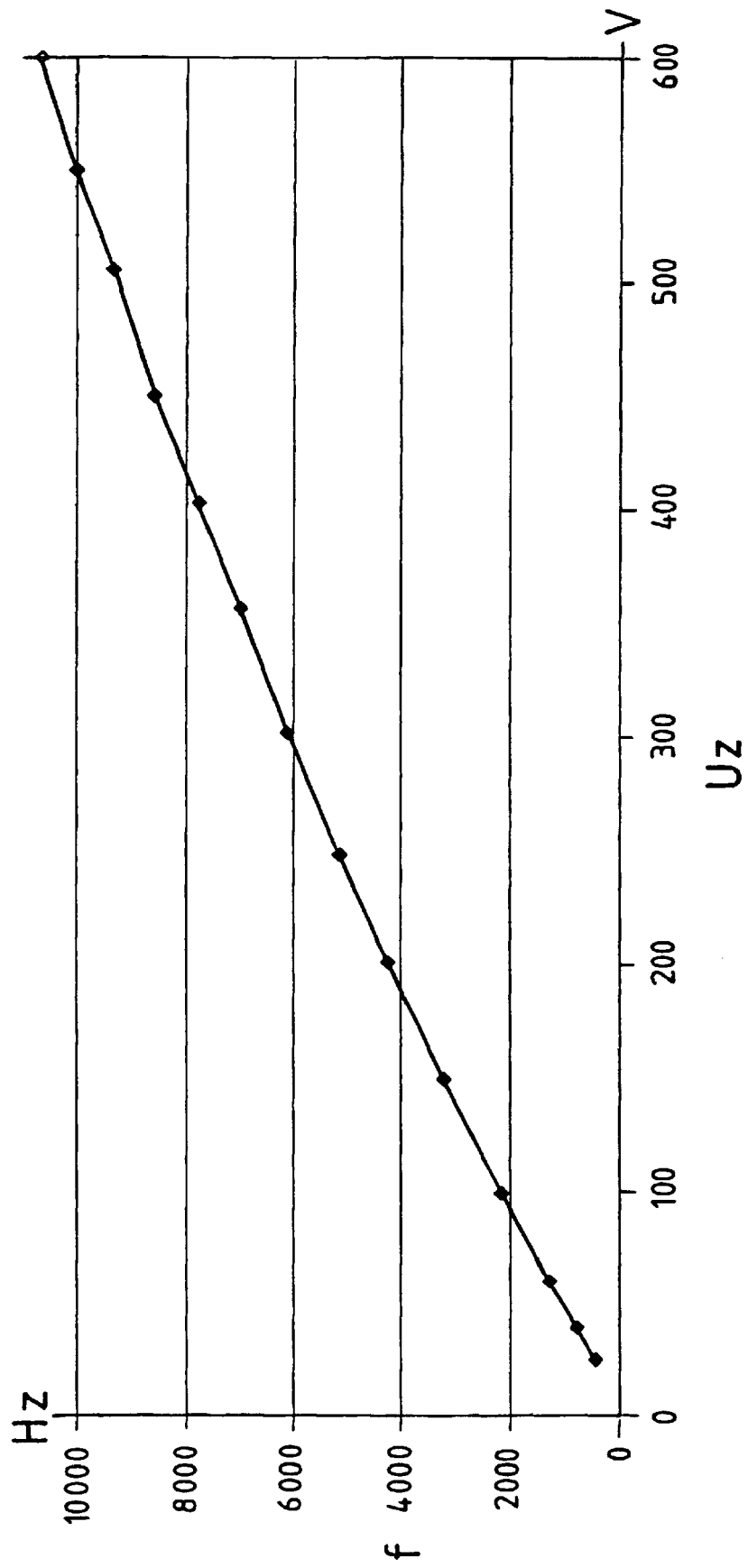
FIG. 3 shows the voltage-response characteristic of the optical coupler used in the circuit of FIG. 2.

FIG. 3 shows the voltage-response characteristic with C1=100 nF and $R_e$=33 kOhm. The almost linear relation between the voltage $U_z$ and the frequency f at which the light-emitting diode LD flashes. Given commercially obtainable components, a precision of approximately 10% is obtained, which is sufficient for most applications.

Although modifications and changes may be suggested by those skilled in the art, it is the intention of the inventor to embody within the patent warranted hereon all changes and modifications as reasonably and properly come within the scope of his contribution to the art.

I claim as my invention:

1. A measuring arrangement for measuring an intermediate circuit voltage of an intermediate circuit in a gradient of a magnetic resonance imaging apparatus amplifier, said intermediate circuit containing an intermediate circuit capacitor with said intermediate circuit voltage being present across said intermediate circuit capacitor, and a discharge path for said intermediate circuit capacitor containing a discharging resistor, said measuring arrangement comprising:

a measuring circuit connected in series with said discharging resistor and being driven exclusively by discharge current from said intermediate circuit capacitor flowing through said discharging resistor;

said measuring circuit containing a potential dividing connection which provides an output signal dependent on said discharging current; and an indicator which receives said signal and which produces an indication of said intermediate circuit voltage dependent on said signal.

2. A measuring arrangement as claimed in claim 1 wherein said measuring circuit comprises:

an astable flip-flop connected in said potential dividing connection, said astable flip-flop having an output which changes state dependent on said discharging current;

a transistor supplied with said astable flip-flop output; and a light-emitting diode connected to and driven by said transistor dependent on said astable flip-flop output, said light-emitting diode emitting light pulses at a frequency which is proportional to said intermediate circuit voltage; and wherein said indicator comprises a photoreceiver which detects said light pulses, and an indicator device which identifies said intermediate circuit voltage from said frequency of said light pulses.

3. A measuring arrangement as claimed in claim 2 wherein said astable flip-flop comprises a thyristor tetrode and a voltage divider which drives said thyristortetrode, said voltage divider containing a Zener diode connected in parallel with a capacitor, said capacitor being connected in series with said discharging resistor and forming an input pf said measuring circuit.

4. A measuring arrangement as claimed in claim 3 wherein said thyristor tetrode comprises two interconnected transistors.

* * * * *